United States Patent [19]

Rzeszewski et al.

[11] 3,949,158
[45] Apr. 6, 1976

[54] WIDE BAND AFT CIRCUIT FOR TELEVISION RECEIVER

[75] Inventors: Theodore S. Rzeszewski, Lombard; Sotirios Sideris, Des Plaines, both of Ill.

[73] Assignee: Quasar Electronics Corporation, Franklin Park, Ill.

[22] Filed: Dec. 31, 1974

[21] Appl. No.: 537,692

[52] U.S. Cl. ........................... 178/5.8 AF; 325/423
[51] Int. Cl.² .......................................... H04N 5/60
[58] Field of Search......... 178/5.8 R, 5.8 A, 5.8 AF, 178/7.3 R, DIG. 15; 325/422, 423, 470

[56] References Cited
UNITED STATES PATENTS

| | | | |
|---|---|---|---|
| 3,715,495 | 2/1973 | Takezaki | 178/5.8 A |
| 3,737,565 | 6/1973 | Ma | 178/5.8 R |
| 3,845,393 | 10/1974 | Basset | 178/DIG. 15 |

*Primary Examiner*—Albert J. Mayer
*Attorney, Agent, or Firm*—LaValle D. Ptak

[57] ABSTRACT

A wide-band automatic fine tuning (AFT) circuit capable of a ±2 MHz pull-in range without false lockups responds to the output of a picture carrier discriminator, a sound carrier discriminator and a vertical synchronizing signal sensing means to operate a reversible digital counter in either its count up or count down direction depending upon the relationship of the outputs of the two discriminators and the synchronizing signal sensing circuit. The output of the counter is supplied to a digital-to-analog converter which produces a tuning control voltage used for controlling the frequency of operation of the local oscillator of the receiver. The output of the digital-to-analog converter is added to a conventional AFT voltage which maintains the desired tuning once it has been established by the wide-band AFT system.

15 Claims, 8 Drawing Figures

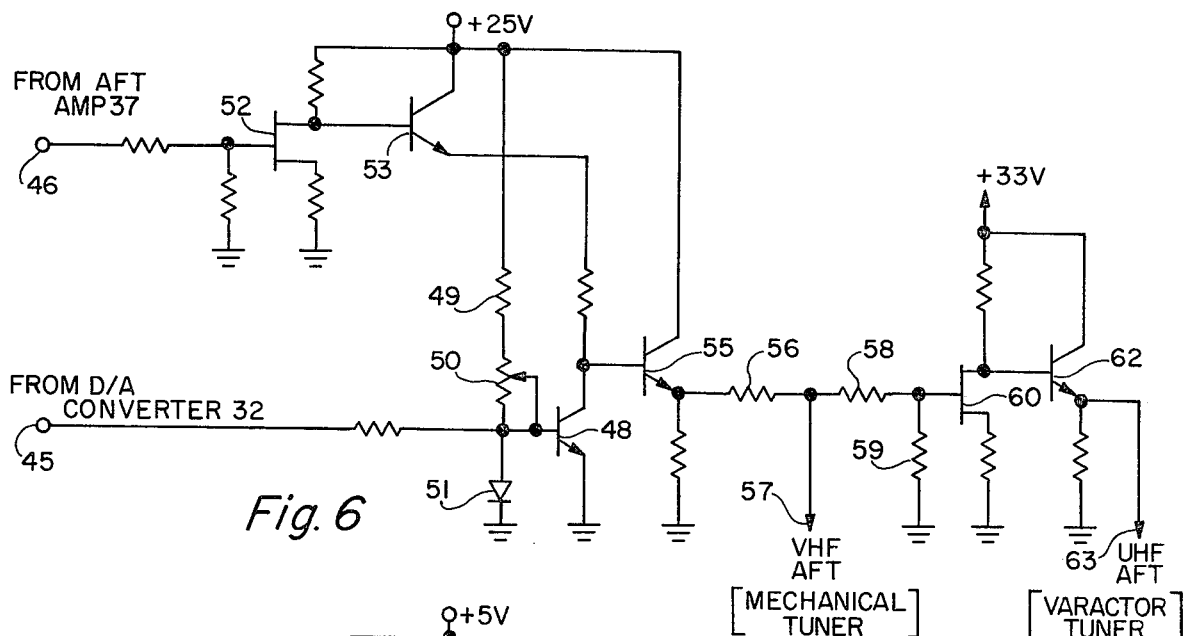
Fig. 6
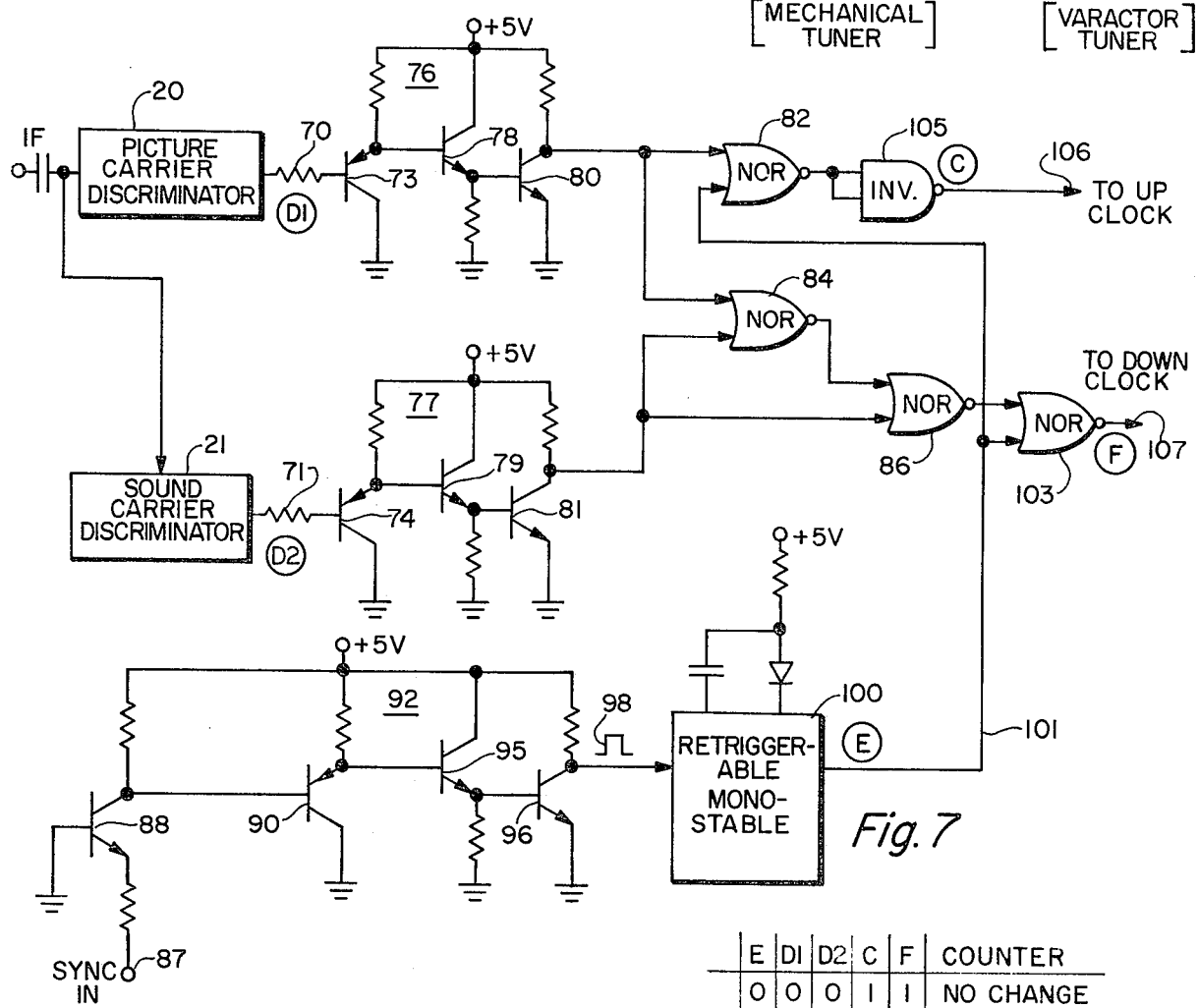
Fig. 7
| E | D1 | D2 | C | F | COUNTER |
|---|----|----|---|---|---------|
| 0 | 0  | 0  | 1 | 1 | NO CHANGE |
| 0 | 1  | 0  | 0 | 1 | UP |
| 0 | 0  | 1  | 1 | 0 | DOWN |
| 0 | 1  | 1  | 0 | 1 | UP |
| 1 | 1  | 1  | 1 | 0 | DOWN |
Fig. 8

WIDE BAND AFT CIRCUIT FOR TELEVISION RECEIVER

BACKGROUND OF THE INVENTION

As improvements have been continually made to television receivers, the number of adjustments which must be made by the viewer have been substantially reduced. One adjustment, however, which still remains is a fine tuning adjustment. Such an adjustment is required even with receivers having an automatic fine tuning (AFT or AFC) system in them. With respect to the VHF channels, the fine tuning adjustment generally is made only when the receiver is first put into operation and then infrequently afterwards as components of the receiver age. For the UHF channels, however, a fine tuning adjustment generally is required each time the UHF station is tuned in by the viewer. This is annoying, and it is desirable to eliminate the need for such a fine tuning adjustment.

Wide-band automatic fine tuning systems, that is, systems capable of properly tuning a receiver having a rough tuning adjustment which is off by as much as ±2 megahertz have been attempted in the past. Generally such wide-band AFT systems require a very stable oscillator at the IF frequency. This substantially increases the cost of the system and adds considerably to the final cost of the television receiver. Because of this, systems requiring such highly stable oscillators have not met with much practical success.

Some television receivers also have been equipped with signal seeking tuning circuits. In some respects these systems resemble a wide-band AFT system inasmuch as the receiver uses a motor to scan the transmission spectrum and to stop the scanning, and therefore tuning of the receiver, in response to the appearance of a video carrier, a sound carrier and generally the horizontal synchronizing signals in a proper relationship to prevent improper lockup of the receiver on the wrong signals. Such systems, however, operate in one direction only, even for systems which are referred to as bi-directional signal seeking systems. The bi-directional systems scan in one direction or the other at the option of the user, or upon completion of a scan in a first direction, automatically reverse to scan the spectrum in the opposite direction.

If a signal seeking system, however, should overshoot the proper tuning for a station for any reason, the tuning direction does not reverse to effect proper tuning. The same result occurs if the station should subsequently drift off the proper frequency in the reverse direction from the scan direction. The only way such signal-seeking tuning systems for television receivers have of subsequently properly returning the receiver in such situations is to reverse the scan direction either manually or by completing the scan of the entire frequency spectrum in the first direction, whereupon reversal takes place.

It is desirable to provide a wide-band AFT system for a television receiver which has a pull-in range wide enough to eliminate the need for viewer fine tuning adjustments once the gross channel settings for tuning the receiver have been made. In addition, it is desirable to provide for such a wide-band AFT system without requiring the use of highly stable oscillators or other expensive components.

SUMMARY OF THE INVENTION

Accordingly, it is an object of this invention to provide an improved automatic fine tuning (AFT or AFC) system for a television receiver.

It is an additional object of this invention to provide an improved wide-band AFT (AFC) system for a television receiver which substantially reduces the need for viewer fine tuning adjustments.

It is a further object of this invention to provide an improved wide-band AFT system for a television receiver using a reversible digital counter in combination with a digital-to-analog converter for producing an AFT tuning voltage.

It is another object of this invention to employ a digital logic circuit responsive to the outputs of a picture carrier discriminator, sound discriminator, and a synchronizing signal sensing circuit to operate a wide-band automatic fine tuning system for a television receiver.

It is yet another object of this invention to employ a wide-band automatic fine tuning system in a television receiver which includes provisions for preventing false lock-ups to adjacent channel signals.

It is a still further object of this invention to provide an automatic fine tuning (AFT) system for a television receiver employing a combination of digital logic and analog circuitry to produce the AFT tuning voltage.

In accordance with a preferred embodiment of this invention, a wide-band automatic fine tuning system for a television receiver includes a digital logic circuit responsive to the outputs of a picture carrier discriminator, a sound carrier discriminator, and a synchronizing signal sensing circuit for controlling the application of clock pulses to either the up or down inputs of a reversible digital counter. The count attained by the counter is converted by a digital-to-analog converter to a control voltage which is combined with the conventional AFT voltage of a television receiver to provide the tuning control voltage used to maintain tuning of the receiver to the proper frequency corresponding to the selected channel.

BRIEF DESCRIPTION OF THE DRAWINGS

FIG. 6 is a detailed schematic diagram of a portion of the circuit illustrated in FIG. 1;

FIG. 7 is a schematic diagram of a portion of the circuit shown in FIG. 1; and

FIG. 8 is a truth table useful in explaining the operation of the circuit of FIG. 7.

DETAILED DESCRIPTION

Figure 1:
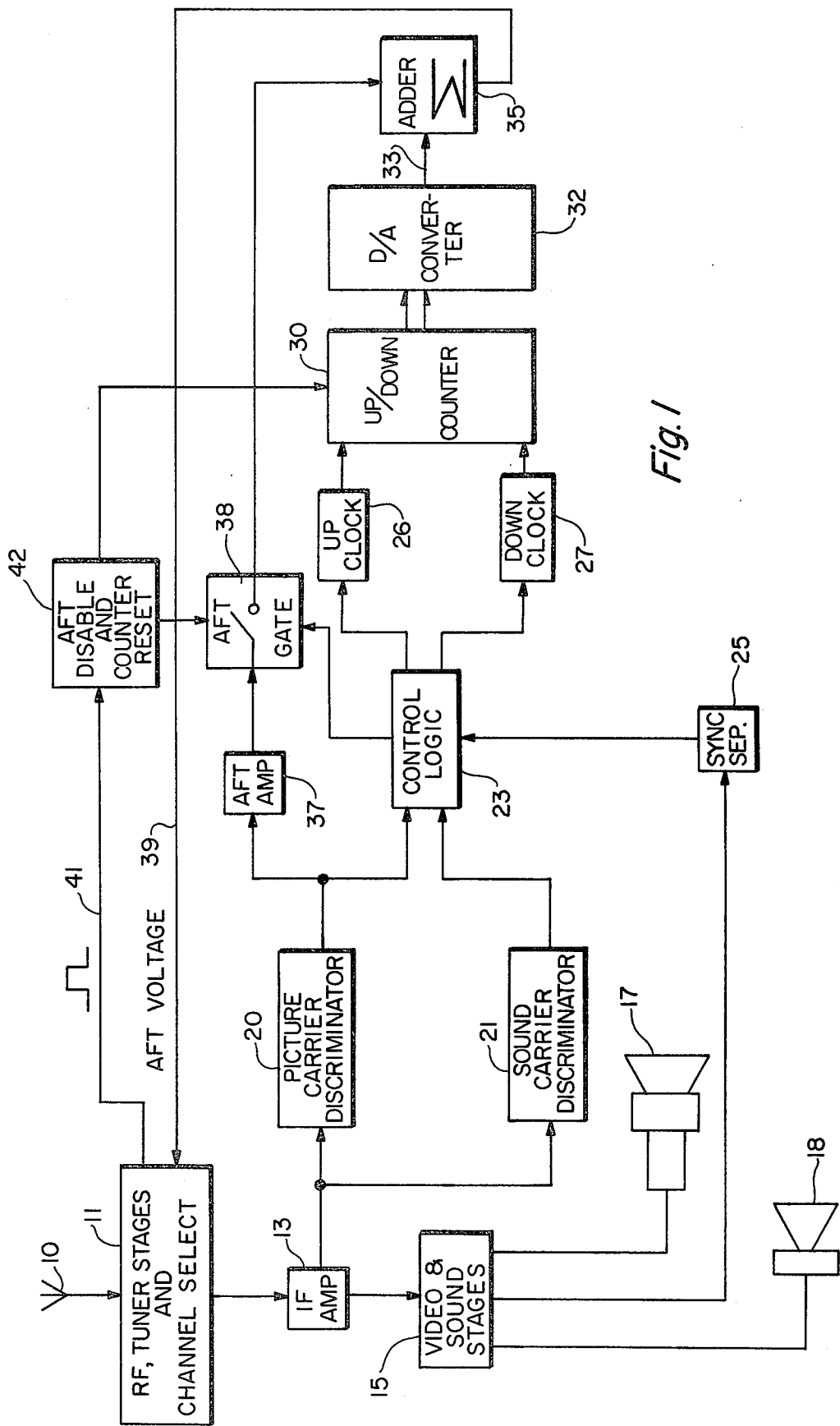
FIG. 1 is a block diagram of a television receiver using a preferred embodiment of this invention.

Referring now to the drawings, FIG. 1 is a block diagram of a television receiver, which may be a black and white or color television receiver. Most of the circuitry of this receiver is conventional and for that reason it has not been shown in FIG. 1. To the conventional television receiver, a wide-band AFT circuit has been added. Transmitted composite television signals including picture and sound carrier components and synchronizing signal components are received on an antenna 10 and are applied to an RF and tuner stage 11, which includes the RF amplifiers and tuner sections of the receiver plus a channel selection means. Preferably the tuner sections include a voltage-controlled oscillator or the like responsive to a direct current tuning control voltage for establishing the desired tuning of the receiver.

The output of the RF and tuner stages of 11 is applied to an IF amplifier stage 13 which supplied the conventional picture (video) and sound IF signals to the video and sound processing states 15 of the receiver. The stages 15 may be of any conventional type used to separate, amplify and otherwise process the signals for application to a cathode ray tube 17 and a loudspeaker 18, which reproduce the picture and sound components, respectively, of the received signal.

The output of the IF amplifier 13 also is supplied to a picture or video carrier discriminator 20 and a sound carrier discriminator 21, which respond, respectively, to the video IF carrier and the sound IF carrier for the received channel. These discriminators may be of any suitable conventional type commonly employed in television receivers. The outputs of the discriminators 20 and 21 are supplied to a control logic circuit 23, which also is provided with synchronizing signals, such as the vertical synchronizing signals of the composite television receiver, obtained from a conventional synchronizing separator circuit 25 coupled with the video and sound stages 15 at the receiver.

The control logic circuit 23 responds to the signals obtained from the discriminators 20 and 21 and the synchronizing signals obtained from the synchronizing signal separator 25 to control the operation of an "up" clock pulse generating circuit 26 and a "down" clock pulse generating circuit 27. These circuits are connected respectively to the "up" and "down" inputs of a reversible digital counter 30. When neither of the clock pulse generating circuits 26 and 27 are enabled, the output of the counter 30 is stable at some count which it attained in response to the previous application of clock pulses from either the "up" clock 26 or the "down" clock 27.

The output of the reversible digital counter 30 is applied to a conventional digital-to-analog converter circuit 32, which may be in the form of a resistive ladder network or the like to produce a direct current tuning control voltage on an output lead 33 which is representative of the count in the counter 30. This control voltage is supplied to an adder circuit 35 where it is combined with a conventional television AFT voltage obtained from the output of the picture carrier discriminator after amplification by an AFT amplifier 37. This amplified AFT voltage is supplied through a normally closed AFT gate switch 38 to the adder 35. The combined or composite tuning control voltage then is supplied by the adder 35 over a lead 39 to the RF and tuner stage sections 11 of the receiver as the AFT or AFC (automatic frequency control) tuning voltage for the local oscillator and other voltage-controlled tuning circuits in the sections 11 of the receiver.

Figure 2:
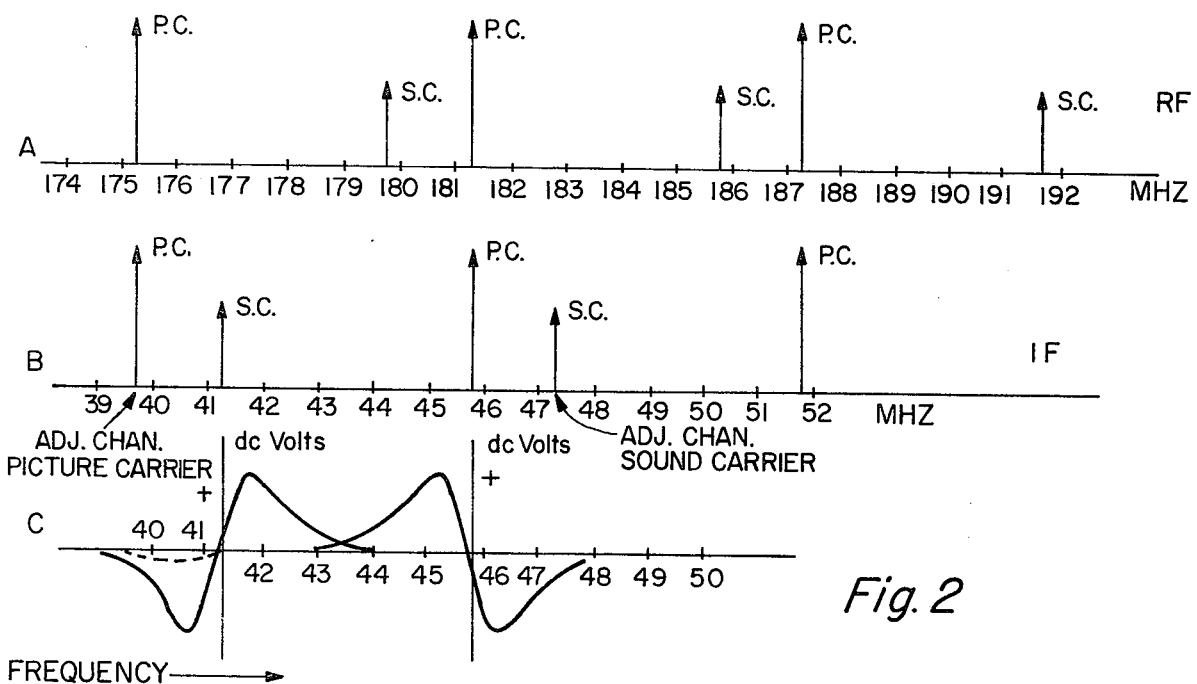
FIGS. 2, 3, 4 and 5 illustrate waveforms useful in explaining the operation of the circuit shown in FIG. 1.

FIG. 2, waveform A, shows the relative positions of the picture and sound carriers for three adjacent television channels. FIG. 2, waveform B, shows the same channels translated down to the television IF frequencies. It will be noted that the relative positions of the IF picture carrier and sound carrier for each channel reverse their relationship from the RF carriers in a conventional manner due to the frequency relationship which is selected for the local oscillator of a television receiver relative to the received signals. For the standard FCC television signal, the IF carrier frequency of a properly tuned picture carrier is at 45.74 megahertz and the sound carrier for that same channel then is at 41.25 megahertz. This is illustrated in waveform B, from which it also can be noted that the adjacent channel sound carrier is at 47.25 megahertz and the next lower adjacent channel picture carrier is at 39.75 megahertz. These are standard frequency spacings.

Waveform C of FIG. 2 shows the frequency response of two discriminators, one centered at the IF picture carrier frequency for a properly tuned channel and the other centered at the IF sound carrier frequency. The characteristics of these discriminators are selected so that if the RF oscillator is tuned low (resulting in a lower IF frequency), the output from the picture carrier discriminator is positive, and if the RF oscillator is tuned high (resulting in a higher IF frequency) the output from the sound carrier discriminator is positive. This information is used in the system of FIG. 1 to determine the tuning position of the local oscillator and to cause the control logic to operate the appropriate one of the clock pulse generators 26 and 27 to effect proper automatic fine tuning.

The two curves which are shown in waveform C are for the case where the input to each of the discriminators is flat over the required frequency range. For the purposes of the wide-band AFT system of FIG. 1, this range preferably is ±2 megahertz from the center frequency. In the standard television system, the inputs to the discriminators are not flat over the required frequency range because of the response characteristics of the IF amplifier stages of the receiver. Typically the picture carrier is attenuated by 6 db, and the rate of attenuation increases rapidly close to the adjacent channel sound carrier. The rate of attenuation also increases rapidly at the other side of the response characteristic of the IF stages where the sound carrier is located. The effect of the IF frequency response is to change the characteristics of the two discriminators from the ones shown in waveform C of FIG. 2 to the corresponding waveforms shown in FIGS. 3 and 4.

Figure 4:
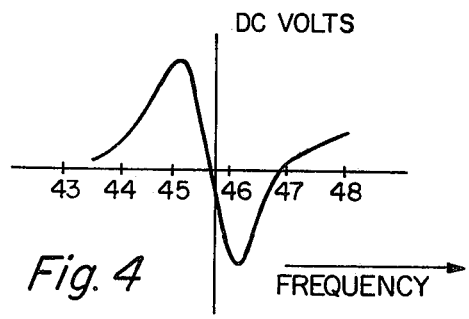

FIG. 4 shows the frequency response of a typical discriminator centered at the IF picture carrier frequency of 45.75 megahertz. From waveform B of FIG. 2 it can be seen that the IF sound carrier frequency for the adjacent channel is at 47.25 megahertz. If the RF oscillator is tuned to a higher frequency toward the next higher adjacent channel (resulting in a higher IF frequency) then the output of the picture carrier discriminator is negative. This value reaches a negative peak and then starts to increase again. Because of the nature of the IF frequency response of the IF amplifier stages 13, the amplitude of the picture carrier decreases and that of the sound carrier increases. The difference in amplitudes is accelerated at the RF oscillator is tuned to a still higher frequency sound carrier.

If the amplitude of the sound carrier is higher than that of the picture carrier, the discriminator output then reverses polarity and becomes positive as shown in the right-hand portion of the waveform of FIG. 4. The point where the waveform again crosses zero is a function of the discriminator characteristics and the characteristics of the IF amplifier stages. From practical measurements, this occurs at about 1 megahertz from the 45.75 zero-line crossing as shown in FIG. 4. The adjacent channel IF sound carrier is 1.5 megahertz higher than the 45.75 megahertz picture carrier. The net effect is that the sound carrier causes the picture carrier discriminator to change its characteristics from the one shown in the right-hand portion of waveform C of FIG. 2 to the waveform shown in FIG. 4.

In the alternative, if the RF oscillator is tuned lower (resulting in a lower IF frequency), the picture carrier increases up to a certain point but the sound carrier decreases rapidly. The level of the picture, however, is sufficient to cause the discriminator to function normally for this portion of its characteristics shown to the left of the center line in FIG. 4.

Figure 3:
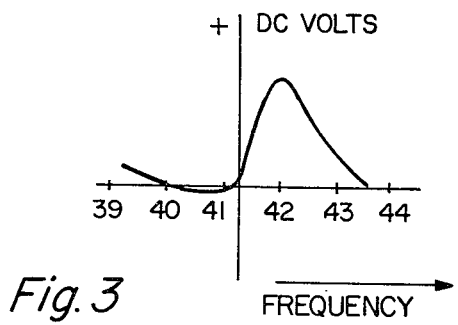

FIG. 3 illustrates the response of the discriminator centered at the IF sound carrier frequency. If the RF oscillator is tuned higher as was done before, resulting in a higher IF frequency, then this discriminator is adjusted to give a positive DC output as shown to the right of the center line in FIG. 3. At the same time, the output of the sound carrier increases while that of the picture carrier decreases; so that if sufficient gain is provided by the discriminator, it functions normally and produces the response shown to the right of the center line of FIG. 3.

If the RF oscillator, however, is tuned lower (resulting in a lower IF frequency); then the amplitude of the sound carrier decreases and that of the picture carrier increases. Because the sound carrier is attenuated considerably to begin with, the negative DC developed by the sound carrier discriminator is very small. The situation is analogous to the one described previously for the picture carrier but is more severe because of the smaller sound carrier signal available. The result is that the discriminator for the sound carrier has a characteristic shown in FIG. 3. This suggests the possibility of using a simple tuned circuit instead of a discriminator at the sound carrier since there is very little negative DC voltage developed.

Figure 5:
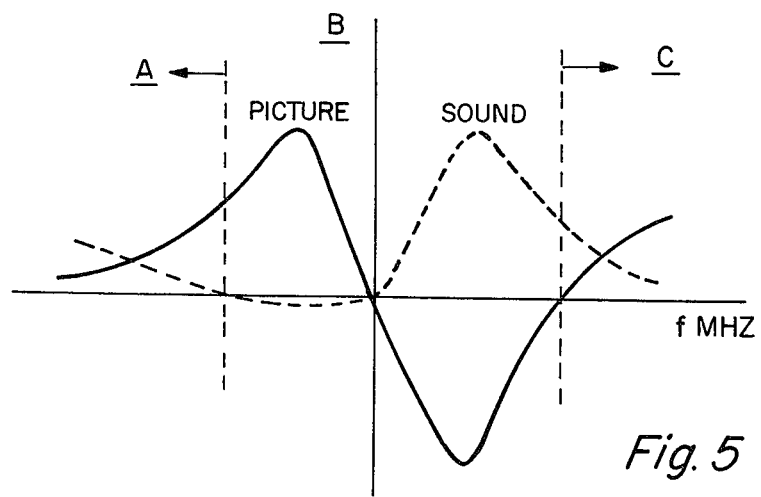

FIG. 5 is a superposition of the two discriminator output voltage waveforms shown in FIGS. 3 and 4, with the center line of both discriminators being common. This is the condition for a properly tuned channel where ideally the output of both discriminators should be zero. FIG. 5 does not indicate absolute frequency, but only the effects on voltage output for tuning deviations from correct tuning where the output of both discriminators is zero volts.

The control logic circuit 23 of FIG. 1 operates in response to these superimposed outputs of the picture carrier discriminator 20 and sound carrier discriminator 21 to make the determinations as to which of the clock pulse generators 26 and 27, if either, should be energized to change the count in the reversible digital counter 30.

When a new channel is selected by the operator of the receiver in a conventional manner, a pulse is supplied over a lead 41 to an AFT disable and counter reset circuit 42 which momentarily opens the switch in the AFT gate 38 and also resets the reversible counter 30 to a predetermined count, preferably a count in the center of the range of counts produced by the counter 30. Once the new channel has been selected, the circuit 42 is ineffective; and the wide-band AFT system of FIG. 1 operates on the IF signals supplied by the IF amplifier 13 to produce the appropriate AFT voltage. Ideally, if the selected channel is properly tuned in by the initial channel selection, the output of the counter does not change, and the fine tuning is maintained by the conventional operation of the picture carrier discriminator and the AFT amplifier 37.

If, however, the RF oscillator is tuned low (resulting in a low IF frequency) the output of the picture carrier discriminator 20 is positive. So long as this output voltage also is higher than a pre-established threshold voltage determined by the control logic 23, it causes the control logic 23 to energize the "up" clock pulse generating circuit 26 to supply clock pulses to the up count input of the counter 30 to step the counter to increasingly higher counts. The output of the counter then is converted by the digital-to-analog converter 32 to provide the appropriate DC control voltage on the lead 39 to raise the frequency of operation of the RF oscillator in the tuner stages 11. In FIG. 5 it can be seen that this operation corresponds to the output signal characteristics of the discriminators 20 and 21 shown on the left side of area B.

At the extreme left of area B in an area A, both the picture and sound discriminators produce a positive output voltage. If the output of the sound discriminator in this area is also above a pre-established threshold voltage which otherwise would cause the control logic to operate the "down" clock pulse generating circuit 27, an unstable condition would result. This is corrected by the control logic circuit 23 which senses that both the picture and sound discriminators are producing a positive output, in which situation only the "up" clock pulse generator 26 is enabled for operation to provide the proper correction voltage to tune the RF oscillator frequency higher (raising the IF frequency).

From an examination of FIG. 5 it can be seen that at the extreme left-hand side of area A the picture carrier discriminator voltage decreases and eventually will become less than the required threshold to operate the "up" clock pulse generator 26. The parameter of the wide-band AFT system are selected to cause it to pull in and lock onto a desired channel from ±2 megahertz. Therefore, the gain of the picture carrier discriminator 20 is adjusted so that the portion of area A where the output voltage of the discriminator 20 output voltage is below the control logic threshold is beyond the 2 megahertz range from the desired center frequency.

If the RF oscillator is tuned high (resulting in a higher IF frequency) then the output of the sound discriminator is positive and the output of the picture discriminator is negative, as shown in the right-hand half of area B in FIG. 5. This condition is detected by the control logic 23 which senses an output of the sound discriminator above a pre-established threshold to energize the "down" clock pulse generator 27 to cause the reversible digital counter 30 to count in the reverse direction. This count is converted by the digital-to-analog converter 32 to a control voltage applied over the lead 39 which decreases the frequency of operation of the RF oscillator until the proper frequency is reached.

If the RF oscillator is mistuned to a high enough frequency (a higher IF frequency) a point can be reached, as shown in area C of FIG. 5, where the outputs of both discriminators 20 and 21 are positive. This is in conflict with the situation shown in area A of FIG. 5 where, as stated previously, the output of the picture carrier discriminator was used to override that of the sound carrier discriminator to tune the RF oscillator higher. This situation, however, for the set of conditions producing the outputs in area C merely would mistune the RF oscillator even more.

In order to overcome this ambiguity, a third piece of information is required by the control logic 23. This additional information is provided by the conventional synchronizing signal circuits of the television receiver. In a typical receiver, the synchronizing signal components change in character or disappear when the receiver is mistuned in the direction producing the set of conditions illustrated in area C of FIG. 5. It is convenient to utilize the vertical synchronizing signals as obtained from the vertical integrator, and this is illustrated in FIG. 1 by showing the synchronizing separator circuit 25 applying an input to the control logic 23. An output of the vertical integrator indicative of a proper relationship of the sync signal components to the other components of the composite signal is present for the tuning conditions resulting in the discriminator output waveforms illustrated in areas A and B of FIG. 5. When the receiver, however, is mistuned to produce the conditions shown in area C of FIG. 5, this output of the vertical integrator disappears of changes. This is sensed by the control logic 23 to override the output signals produced by the two discriminators 20 and 21 to enable the "down" clock pulse generator 27 for operation to provide a proper correction voltage to the oscillator through the reversible counter 30 and the digital-to-analog converter 32. As a result, the output of the picture carrier discriminator 20, which is positive in area C, is prevented from producing the wrong polarity correction voltage, which otherwise would occur in the absence of the overriding control provided by the vertical synchronizing signal detection in the control logic 23. Other outputs from the synchronizing signal separator circuits 25 of a conventional television receiver could be utilized to accomplish the same purpose, but it is convenient to use the output of the vertical integrator.

The operation of the system utilizing the control logic 23 to perform the functions described considerably reduces the effects of adjacent channel sound carrier interference on the operation of the wide-band AFT system. If the synchronizing signal sensing circuit override provision were not present and the set was sufficiently mistuned with an adjacent channel present, the sound carrier of the adjacent channel would produce a positive DC voltage in the picture carrier discriminator 20 which would otherwise be sensed by the system as an operation in the left-hand portion of area B shown in FIG. 5. This would produce the wrong control voltage for the RF oscillator and would result in a mistuning of the oscillator even further. Because the synchronizing signal override provision is present, however, this situation is prevented from occurring and proper control is effected.

Referring now to FIG. 6, there is shown a detailed schematic diagram of the adder circuit 35 which is used to combine the control voltage from the output of the digital-to-analog converter with the conventional AFT voltage obtained from the amplifier 37 and passed through the AFT gate 38. The control voltage from the digital-to-analog converter is applied to an input terminal 45 in the adder circuit, and the AFT voltage from the amplifier 37 is applied to an input terminal 46.

By using a reversible counter 30 with a digital-to-analog convertor 32, the voltage appearing on lead 33 and applied to input terminal 45 in FIG. 6 remains fixed once the clock input signals form the clock pulse generators 26 and 27 are terminated. This type of a system is preferable to a system where a capacitor is charged up or down to derive a ramp since there is no problem of drifting which occurs with a capacitor due to leakage of the charge.

The digital-to-analog converter output voltage is applied to the base of an NPN amplifier transistor 48, which has a pre-established bias voltage applied to its base from a voltage divider comprising a pair of resistors 49 and 50 and a diode 51 connected in series across a +25 volt power supply. The resistor 50 is a potentiometer which can be used to vary the bias signal level applied to the transistor 48. The tuning voltage from the digital-to-analog converter 32 appears on the collector of the transistor 48 where it is combined with the conventional AFT voltage applied on the terminal 46 and amplified by a field effect transistor 52 and an NPN transistor 53. This combination of the wide-band AFT voltage and the conventional AFT voltage appears on the base of an NPN emitter-follower transistor 55, and the voltage appearing on the emitter of the transistor 55 is applied through a resistor 56 to a VHF AFT output terminal 57. This comprises the AFT voltage which is supplied to the VHF tuner sections of the receiver. Normally the voltage at this point is approximately 3.5 volts DC. This voltage is further divided by a pair of resistors 58 and 59 and is level-shifted by a field effect transistor 60 and an NPN emitter-follower transistor 62 to provide the tuning voltage and proper polarity of AFT voltage for the UHF tuners of the receiver, which typically utilize varacter diodes in the tuning sections. The UHF AFT voltage appears on terminal 63 and normally is at approximately +25 volts DC.

As stated previously, whenever a new channel is selected, the counter 30 is set to cause the ramp generated by the digital-to-analog converter 32 to be near the mid-point of the voltages which can be supplied from the converter 32. The number of stages in the counter 30 also are selected to cause the ramp to be divided in to a sufficient number of discrete steps to present a relatively smooth output ramp from the digital-to-analog converter 32. A counter capable of dividing the ramp into 256 steps is considered sufficient for a total peak-to-peak voltage from the output of the digital-to-analog convertor 32 of 3.6 volts. This results in 14 millivolts per step which has been found to be adequate for utilization with the system adjusted to provide a ±2 megahertz pull-in range as desired.

FIG. 7 shows details of the control logic circuit 23 used to effect the operation which previously has been discussed in conjunction with FIG. 1. The signals from the IF amplifier 13 are applied to the picture carrier discriminator 20 and the sound carrier discriminator 21 which have been shown again in FIG. 7 for convenience. The outputs of these discriminators each are applied through coupling resistors 70 and 71, respectively, to the base of corresponding PNP input transistors 73 and 74 in a pair of threshold switching amplifiers 76 and 77. The PNP input transistors 73 and 74 each are operated as emitter followers and drive NPN emitter-follower transistors 78 and 79, respectively, which in turn are coupled to the bases of respective NPN output transistors 80 and 81. The threshold switching amplifier circuits each operate to amplify AFT voltage applied to their inputs through the resistors 70 and 71 when that voltage reaches one diode drop above ground and translate this voltage to digital logic voltages used to drive three NOR gates 82, 84 and 86.

The third input to the control logic circuit 23, which is shown in detail in FIG. 7, is applied from the vertical integrator in the synchronizing separator circuit 25 on an input terminal 87 coupled to the emitter of a grounded base NPN transistor 88. The signals appearing on the collector of the transistor 88 are applied to the base of an NPN input emitter-follower transistor 90 in a threshold switching and amplifying circuit 92 similar to the switching an amplifying circuits 76 and 77. When the transistor 88 conducts, the potential on its collector drops to bias the transistor 90 into conduction which in turn renders non-conductive a normally conductive NPN emitter-follower transistor 95 which in turn causes an output NPN transistor 96 for the circuit to be rendered non-conductive. This causes the potential on the collector of the transistor 96 to rise to produce a positive-going output pulse 98 each time a negative pulse 94 is applied to the input terminal 87. When they appear, the pulses 98 reset a retriggerable monostable multivibrator 100 to its astable state producing on its output a "high" or 1 digital logic voltage.

The logic output from the multivibrator 100 is applied to an output lead 101 which is connected to one input of the NOR gate 82 and one input of a NOR gate 103. The other input to the NOR gate 103 is obtained from the output of the NOR gate 86, which in turn is controlled by the output of the NOR gate 84 and by the signal present on the collector of the transistor 81 in the circuit 77. Similarly the second inputs for the NOR gates 82 and 84 are obtained from the collector of the transistor 80 in the circuit 76.

The output of the NOR gate 82 is supplied through an inverter 105 coupled to an output terminal 106 which controls the operation of the "up" clock pulse generator 26 (FIG. 1). Similarly, the output of the NOR gate 103 is connected to an output terminal 107 which is coupled to the input of the "down" clock pulse generator 27 (FIG. 1), to control the operation of that generator. The characteristics of the generators 26 and 27 are such that whenever a "low" or 0 logic level input is applied to them, they operate to supply clock pulses to the counter 30. Whenever a "high" or logic 1 input is applied to the clock pulse generators 26 or 27, they do not operate and no pulses are supplied from the generator having such a high input applied to it.

The retriggerable monostable multivibrator 100, together with the input circuit comprising the high impedance take-off NPN transistor 88 having its emitter coupled to the output of the vertical integrator and the transistors 90, 95 and 96 are used to indicate that the RF oscillator is mistuned enough to effect the sync circuits. The gain of the transistor 88 and PNP emitter-follower transistor 90 is selected so that when the RF oscillator of the receiver is tuned properly or even at the high end of the 2 megahertz pull-in range of the AFT circuit, the output of the NPN transistor 96 is near ground potential. This results from the application of a relatively constant high potential on the terminal 87 which in turn through the operation of the transistors 88, 90 and 95 causes the transistor 96 to be rendered conductive. This produces a low or near ground potential on the collector of the transistor 96, and the monostable multivibrator 100 is in its stable state producing a low level voltage or logical 0 output on the lead 101. This enables the NOR gates 82 and 103 for operation and permits the discriminators 20 and 21 to control the operation of the clock pulse generators 26 and 27.

If the RF oscillator is mistuned sufficiently high, however, then the output of the vertical integrator of the receiver increases, producing a series of negative-going pulses 94 on the emitter of the transistor 88. This in turn causes a series of positive-going pulses 98 to appear on the collector of the transistor 96 which trigger and continuously retrigger the monostable multivibrator 100 into its astable state, producing a "high" or logic 1 output on the lead 101. This "high" output then excludes control of the "up" and "down" clock pulse generators 26 and 27 by either of the two discriminators because of the overriding action of the high input on the lead 101 on the NOR gates 82 and 103.

The truth table of FIG. 8 illustrates the operation of the circuit in response to the various conditions which can exist in conjunction with mistuning of the receiver to produce the various combinations of outputs from the discriminators 20 and 21 which previously have been discussed in conjunction with mistuning of the receiver to produce the various combinations of outputs from the discriminators 20 and 21 which previously have been discussed in conjunction with FIG. 5. If the output of the vertical integrator continues to be a relatively "high" output, the retriggerable monostable multivibrator is in its stable state producing a logic 0 at point E on the lead 101. If the receiver also is properly tuned to the correct frequency or is only slightly mistuned in either direction below the threshold of the switches 76 and 77, the outputs of the discriminators 20 and 21 also may be considered to be logic 0 outputs. This results in logic 1 or "high" outputs on the collectors of the transistors 80 and 81 in both of the circuits 76 and 77. The logic 1 output applied to the NOR gate 82 causes its output to go low (logic 0) and this is inverted by the inverter 105 to a logic 1 or "high" output on the output terminal 106. Thus, the "up" clock pulse generator 26 is not enabled.

Similarly, the logic "high" input obtained from the collector of the transistor 81 and applied to the NOR gate 86 results in a "low" output obtained from that NOR gate. As a consequence, both of the inputs to the inputs to the NOR gate 103 are low causing its output also to be a logic 1 or "high" output on the terminal 107. Thus, the "down" clock pulse generator 27 also is not energized. This is the condition of operation for a properly tuned receiver; and at this point, the control of the AFT voltage of the receiver is effected by the conventional AFT amplifier circuit 37 operating through the circuit previously described in FIG. 6.

Now assume that the output of the vertical integrator remains the same so that the logic level E on lead 101 remains at 0, but that the output of the picture carrier discriminator 20 becomes sufficiently positive to exceed the threshold of the switch 76. This is indicated as a logic level 1 at point D1. Under this condition of operation, the potential on the collector of the transistor 80 drops "low" to a logic level 0. This results in a "high" or logic level 1 output from the NOR gate 82, which is inverted by the inverter 105 to a "low" or 0 output on the terminal 106. This energizes the "up" clock pulse generator 26 for operation. At the same time, the output of the NOR gate 103 remains high; because the output of the NOR gate 86 is low due to the high input applied to it from the collector of the transistor 81.

Now assume that again the output of the vertical integrator remains such that the logic level E on lead 101 remains "low" or 0, but that the output of the sound carrier discriminator 21 now becomes a logic level 1 and that of the picture carrier discriminator becomes a logic level 0. When this occurs, the "high" or 1 output appearing on the collector of the transistor 80 causes the "high" or 1 signal to be applied to the "up" clock terminal 106 as described previously. The NOR gate 86, however, now has two "low" or logic level 0 inputs applied to it, so that its output goes "high". This in turn causes the output of the NOR gate 103 to go "low" or 0 which enables the "down" clock pulse generator 27 for operation.

If both of the discriminators 20 and 21 produce "high" outputs while the vertical synchronizing signal input remains high to produce a "low" or 0 level on the lead 101, the "down" clock pulse signal at the output of the NOR gate 103 is "high" or "1", while the signal on the terminal 106 for the "up" clock pulse generator is "low" or 0. This can be ascertained by following through the logic operations of the circuit in the manner described above for the other conditions of operation.

Now assume both of the discriminators 20 and 21 produce a "high" or 1 logic level output, corresponding to the condition in area C of FIG. 5, and that the synchronizing signal input at the same time changes; so that a sequence of negative-going pulses 94 appear on the terminal 87. This results in a sequence of positive-going pulses 98 applied to the retriggerable monostable multivibrator 100, as described previously, which in turn causes the output logic level on the lead 101 at point E to become a "high" or 1 output. This forces the "down" clock output at the terminal 107 to go low and simultaneously forces the inverted output of the NOR gate 82 to appear as a "high" or logic level 1 output on the terminal 106. Thus, for this condition of operation, the synchronizing signal input controls to cause the tuning of the receiver to be in the proper direction, overrding the outputs of either of the discriminators 20 and 21.

It is not necessary to use the output of the vertical integrator as the third information applied to the terminal 87. Any point in the synchronizing signal circuits where a change occurs in response to mistuning of the type discribed will suffice. The noise immunity, however, is good in the vertical integrator portion, because the integrator has a narrow bandwidth.

An alternative to using the reversible digital counter and the digital-to-analog converter would be to replace these circuit components with dual current sources. One source would be energized for charging a capacitor to create a ramp with a positive slope and the other current source would be energized for discharging the capacitor to create a ramp with a negative slope. Once the RF oscillator used with such an embodiment were tuned properly, the current sources would be turned off or disconnected from the capacitor and the charge on the capacitor then could be coupled to the terminal 45 of FIG. 6 to constitute the proper voltage from the wide-band AFT circiut. Of course, this type of system would necessitate a high input impedance for the output circuit coupled to the capacitor, such as could be obtained by using a field effect transistor or the like.

The system described is capable of accurate wide-band AFT operation with ±2 megahertz from the center tuning. It has excellent rejection of adjacent channel sound carrier interference. The system also is capable of implementation in integrated circuit form if desired, which should result in a substantial reduction in cost of implementing the system.

We claim:

1. A wide-band automatic fine tuning system for a television receiver capable of receiving a composite television signal having at least picture carrier components, sound carrier components, and synchronizing signal components, said system including in combination:
    picture carrier sensing means providing an output voltage indicative of the tuning of said receiver to a picture carrier component of said composite signal;
    sound carrier sensing means providing an output voltage indicative of the tuning of the receiver to a sound carrier component of the composite signal;
    synchronizing signal component sensing means for providing a first predetermined output with synchronizing signal components sensed thereby in proper relationship with the other components of said composite signal, and for providing a second predetermined output when said proper relationship is not present;
    reversible ramp generator means for providing a direct current tuner control voltage for use in attaining and maintaining tuning of the television receiver;
    gating circuit means coupled with the outputs of said picture carrier sensing means said sound carrier sensing means and said synchronizing signal component sensing means and further coupled with said reversible ramp generator means for causing said generator means to generate a ramp voltage in one direction when a first relationship between the output voltages of said picture and sound carrier sensing means exists and for causing said ramp generator means to generate a ramp voltage in the opposite direction when a second relationship of the output voltages of said picture and sound carrier sensing means exists at the same time said synchronizing signal sensing means provides said first predetermined output, said gating circuit means causing said ramp generator means to generate a ramp voltage in said one direction whenever said second predetermined output of said synchronizing signal sensing means is present.

2. The combination according to claim 1 wherein said picture carrier sensing means and said sound carrier sensing means comprise first and second discriminators, respectively.

3. The combination according to claim 1 further including AFT circuit means coupled with the output of said picture carrier sensing means for producing an AFT voltage; and means for adding said AFT voltage with the output of said ramp generator means to produce a composite direct current tuner control voltage for the tuner of the television receiver.

4. The combination according to claim 1 wherein said synchronizing signal component sensing means includes a retriggerable monostable multivibrator for providing said first predetermined output continuously so long as said proper relationship of said synchronizing signal components exists and for providing said second predetermined output after termination of said proper relationship of said synchronizing signal components with the other components of said composite signal.

5. A wide-band automatic fine tuning system for the tuner of a television receiver capable of receiving a composite television signal having at least picture carrier components, sound carrier components and synchronizing signal components, said system including in combination:
    picture carrier sensing means providing an output voltage indicative of the tuning of said receiver to a picture carrier component of said composite signal;

sound carrier sensing means providing an output voltage indicative of the tuning of the receiver to a sound carrier component of the composite signal;

synchronizing signal component sensing means for providing a first predetermined output with synchronizing signal components sensed thereby in proper relationship with the other components of said composite signal, and for providing a second predetermined output when said proper relationship is not present;

reversible digital counter means for providing varying digital counts in response to clock pulses applied to either of first and second inputs, the application of clock pulses to said first input causing said counter to count in one direction and the application of clock pulses to said second input causing said counter to count in the opposite direction;

clock pulse generating means;

gating circuit means coupled with the ouputs of said picture carrier sensing means, said sound carrier sensing means, and said synchronizing signal component sensing means and further coupled with the first and second inputs of said digital counter means and said clock pulse generating means for causing clock pulses to be applied to the first input thereof when a first relationship between the output voltages of said picture and sound carrier sensing means exists, and for causing clock pulses to be applied to the second input of said counter when a second relationship of the output voltages of said picture and sound sensing means exists at the same time said synchronizing signal sensing means provides said first predetermined output, said gating circuit means causing clock pulses to be applied to the second input of said counter means when said first relationship of the output voltages of said picture and sound sensing means exists with said second predetermined output of said synchronizing signal sensing means being present; and means coupled with the output of said counter means for producing a direct current tuner control voltage corresponding to the count in said counter means for use in attaining and maintaining tuning of the television receiver.

6. The combination according to claim 5 wherein said picture carrier sensing means and said sound carrier sensing means comprise first and second discriminators, respectively.

7. The combination according to claim 6 wherein said first relationship of the output voltages of said picture and sound discriminators exists when the output of said picture discriminator is positive, said second relationship of the output voltage of said picture and sound discriminators exists when the output of said sound discriminator is positive, and a positive output from said picture discriminator occurring simultaneously with said second predetermined output from said synchronizing signal component sensing means causing said gating circuit means to cause clock pulses to be applied to the second input of said counter means.

8. The combination according to claim 5 wherein said means coupled with the output of said counter means comprises a digital-to-analog converter for producing said direct current tuner control voltage.

9. The combination according to claim 8 further including AFT circuit means coupled with the output of said picture carrier sensing means for producing an AFT voltage, and means for adding said AFT voltage with the output of said digital-to-analog converter to produce a composite direct current tuner control voltage for the tuner of the television receiver.

10. The combination according to claim 5 wherein said synchronizing signal component sensing means includes a retriggerable monostable multivibrator which produces said first predetermined output in response to said proper relationship of synchronizing signal components and provides said second predetermined output a predetermined time interval after the termination of said proper relationship.

11. The combination according to claim 10 wherein said gating means includes first, second, third and fourth coincidence gates, each having first and second inputs and an output, the first inputs of said first and second coincidence gates coupled with the output of said picture carrier sensing means, the second input of said first coincidence gate and the first input of said fourth coincidence gate coupled with the output of said synchronizing signal component sensing means, the second input of said second coincidence gate and the first input of said third coincidence gate coupled with the output of said sound carrier sensing means, the output of said second coincidence gate coupled with the second input of said third coincidence gate, the output of said third coincidence gate coupled with the second input of said fourth coincidence gate, and the output of said first coincidence gate coupled with said clock pulse generating means for causing clock pulses to be applied to the first input of said reversible digital counter means and the output of said fourth coincidence gate coupled with said clock pulse generating means for causing clock pulses to be applied to the second input of said reversible digital counter means.

12. The combination according to claim 11 further including first and second threshold circuit means coupled between the first inputs of said first and second gates and the output of said picture carrier sensing circuit means and comprising a second threshold circuit coupled between the output of the sound carrier sensing circuit means and the second input of said second gate and the first input of said third 13. The combination according to claim 12 wherein said picture carrier sensing circuit means comprises a picture carrier discriminator and said first threshold circuit means provides a first predetermined digital output when the output voltage of said picture carrier discriminator is high and a second predetermined digital output when the output voltage of said picture carrier discriminator is low; and said sound carrier sensing means comprises a sound carrier discriminator and said second threshold circuit means produces a first predetermined digital output when the output voltage of said sound carrier discriminator is high and a second predetermined digital output when the output voltage of said sound carrier discriminator is low.

14. An automatic fine tuning system for the tuner of a television receiver capable of receiving a composite television signal having at least carrier signal components and synchronizing signal components, said system including in combination:

carrier sensing means providing an output voltage indicative of the tuning of said receiver to a carrier component of said composite signal;

synchronizing signal component sensing means for providing a first predetermined output with synchronizing signal components sensed thereby;

reversible digital counter means for providing varying digital counts in response to clock pulses applied thereto;

gating circuit means coupled with the outputs of said carrier sensing means and said synchronizing signal components sensing means and further coupled with said digital counter means for causing said counter means to count in one direction when a first relationship between the output voltages of said carrier sensing means and said synchronizing signal components sensing means exists and for causing said counter means to count in the opposite direction when a second relationship of the output voltages of said carrier sensing means and said synchronizing signal components sensing means exists; and means coupled with the output of said counter means for producing a tuner control signal corresponding to the count in said counter means for use in attaining and maintaining tuning of the television receiver.

15. The combination according to claim 14 wherein said carrier sensing means comprises a picture carrier sensing means providing an output voltage indicative of the tuning of said receiver to a picture carrier component of the composite signal, and further includes sound carrier sensing means providing an output voltage indicative of the tuning of the receiver to a sound carrier component of the composite signal, and wherein said counter is caused to count in said one direction when a first relationship between the output voltages of said picture and sound carrier sensing means exists, and is caused to count in said opposite direction when a second relationship of the output voltages of said picture and sound carrier sensing means exists at the same time said synchronizing signal components sensing means provides a first predetermined output and wherein said counter means is caused to count in said opposite direction when said first relationship of the output voltages of said picture and sound carrier sensing means exists simultaneously with a second predetermined output of said synchronizing signal components sensing means.

* * * * *

UNITED STATES PATENT AND TRADEMARK OFFICE
CERTIFICATE OF CORRECTION

PATENT NO. : 3,949,158
DATED : April 6, 1976
INVENTOR(S) : Theodore S. Rzeszewski and Sotirios Sideris It is certified that error appears in the above-identified patent and that said Letters Patent are hereby corrected as shown below:

> Column 4, line 55, after "frequency", delete "sound carrier".

Signed and Sealed this

Tenth Day of August 1976

[SEAL]

Attest:

RUTH C. MASON
Attesting Officer

C. MARSHALL DANN
Commissioner of Patents and Trademarks